US012642151B2

(12) United States Patent
Shin et al.

(10) Patent No.: US 12,642,151 B2
(45) Date of Patent: May 26, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Seungwan Shin, Suwon-si (KR); Junghoon Kang, Suwon-si (KR); Byungmin Yu, Suwon-si (KR); Jung Hyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 457 days.

(21) Appl. No.: 18/204,161

(22) Filed: May 31, 2023

(65) Prior Publication Data

US 2024/0136261 A1 Apr. 25, 2024
US 2024/0234268 A9 Jul. 11, 2024

(30) Foreign Application Priority Data

Oct. 25, 2022 (KR) ........................ 10-2022-0138423

(51) Int. Cl.
H01L 23/498 (2006.01)
H01L 23/31 (2006.01)

(52) U.S. Cl.
CPC .... H01L 23/49811 (2013.01); H01L 23/3128 (2013.01); H01L 23/49838 (2013.01)

(58) Field of Classification Search
None
See application file for complete search history.

(56) References Cited

U.S. PATENT DOCUMENTS

| | | | |
|---|---|---|---|
| 9,343,434 B2 | 5/2016 | Chen | |
| 9,589,900 B2 | 3/2017 | Su et al. | |
| 9,666,522 B2 | 5/2017 | Huang et al. | |
| 9,721,933 B2 | 8/2017 | Chen | |
| 9,728,508 B2 | 8/2017 | Lin et al. | |
| 10,115,668 B2 | 10/2018 | Reingruber et al. | |
| 10,825,778 B2 * | 11/2020 | Bae ..................... | H01L 23/5226 |
| 11,107,772 B2 | 8/2021 | Chiang et al. | |
| 11,158,579 B2 | 10/2021 | Lee et al. | |
| 2015/0348912 A1 * | 12/2015 | Su .......................... | H01L 23/544 |
| | | | 438/123 |
| 2020/0273806 A1 * | 8/2020 | Chiang ................ | B23K 26/402 |
| 2022/0068818 A1 | 3/2022 | Song et al. | |
| 2022/0165634 A1 * | 5/2022 | Kang .................. | H01L 23/5386 |

FOREIGN PATENT DOCUMENTS

KR 10-2022-0027333 A 3/2022

* cited by examiner

*Primary Examiner* — Cory W Eskridge
(74) *Attorney, Agent, or Firm* — Sughrue Mion, PLLC

(57) ABSTRACT

A semiconductor package includes: a first redistribution substrate; a semiconductor chip provided on the first redistribution substrate; a molding material molding the semiconductor chip and the first redistribution substrate; and a second redistribution substrate provided on the molding material, wherein the second redistribution substrate includes: at least one redistribution line; a metal pad; and a dielectric layer molding the at least one redistribution line and the metal pad, wherein the dielectric layer includes a marking region on the metal pad, and the metal pad includes a plurality of concave portions.

17 Claims, 14 Drawing Sheets

FIG. 1

BRDL

SEMICONDUCTOR PACKAGE AND METHOD OF MANUFACTURING THE SAME

CROSS-REFERENCE TO RELATED APPLICATION

This application claims priority to Korean Patent Application No. 10-2022-0138423 filed on Oct. 25, 2022, in the Korean Intellectual Property Office, the disclosure of which is incorporated by reference herein in its entirety.

BACKGROUND

The present disclosure relates to a semiconductor package and a method of manufacturing the same.

In the semiconductor industry, there is a need to improve integration density so that more passive or active devices can be integrated within a given area. Accordingly, there is an increasing need for packaging technologies that provide high integration density, and as the packaging technology, a package-on-package (POP) technology, in which an upper semiconductor package is stacked on top of a lower semiconductor package.

In order to form an alignment mark or a recognition mark in the POP type semiconductor package, laser marking may be performed on an upper surface of a dielectric layer included in a back side redistribution layer (BRDL). However, when the laser output is set to be high during marking and the laser marking depth becomes longer than the thickness of the dielectric layer of the BRDL, damage may occur to the lower layer of the dielectric layer of the BRDL. Further, when the laser power is set low and the laser marking depth becomes shorter than the thickness of the dielectric layer of the BRDL, the visibility of the mark to be identified becomes dark.

Therefore, there is a need to develop a new packaging technology capable of improving the visibility of marks provided on the dielectric layer without damaging the lower layer of the dielectric layer of the BRDL.

SUMMARY

One or more example embodiments provide a semiconductor package of a package-on-package type and a method of manufacturing the semiconductor package, which can be mass produced and improves the visibility of a mark by forming a metal seed layer and a metal layer including a pattern in a dielectric layer included in a back side redistribution layer.

According to an aspect of an example embodiment, a semiconductor package includes: a first redistribution substrate; a semiconductor chip provided on the first redistribution substrate; a molding material molding the semiconductor chip and the first redistribution substrate; and a second redistribution substrate provided on the molding material, wherein the second redistribution substrate includes: at least one redistribution line; a metal pad; and a dielectric layer molding the at least one redistribution line and the metal pad, wherein the dielectric layer includes a marking region on the metal pad, and the metal pad includes a plurality of concave portions.

According to an aspect of an example embodiment, a semiconductor package includes: a first redistribution substrate including: a first dielectric layer; and at least one first redistribution line provided in the first dielectric layer; a semiconductor chip provided on the first redistribution substrate; a through via provided on the first redistribution substrate; a conductive connection member electrically coupling the at least one first redistribution line and the semiconductor chip; a molding material molding the first redistribution substrate, the semiconductor chip, and the through via; and a second redistribution substrate provided on the molding material, wherein the second redistribution substrate includes: a second dielectric layer; at least one second redistribution line; a metal pad provided on the second dielectric layer; and a third dielectric layer molding the second dielectric layer, the at least one second redistribution line, and the metal pad, wherein the through via electrically couples the first redistribution substrate and the second redistribution substrate, wherein the third dielectric layer includes a marking region, the marking region includes a marking pattern, and the metal pad includes: a metal seed layer; and a metal layer including a pattern provided at a predetermined interval on the metal seed layer.

According to an aspect of an example embodiment, a method of manufacturing a semiconductor package, the method includes: forming a first dielectric layer; forming a metal seed layer on the first dielectric layer; forming a photoresist pattern on the metal seed layer to expose the metal seed layer at predetermined intervals; forming a metal pattern by plating a metal on the exposed metal seed layer; removing the photoresist pattern; forming a second dielectric layer on the metal seed layer and on the metal pattern; and marking the second dielectric layer with a laser in a laser-marked region.

BRIEF DESCRIPTION OF THE DRAWINGS

The above and other aspects and features will be more apparent from the following description of example embodiments taken in conjunction with the accompanying drawings, in which:

FIG. 1 is a top plan view illustrating an upper surface of a back side redistribution layer including a marking region and a redistribution region according to one or more example embodiments.

FIG. 5 is a cross-sectional view illustrating a package-on-package type semiconductor package including a back side redistribution layer on which a laser marking pattern is formed according to one or more example embodiments.

FIG. 6 is a cross-sectional view illustrating an operation of forming a metal seed layer on a dielectric layer provided among the operations of a method of manufacturing a semiconductor package according to one or more example embodiments.

FIG. 7 is a cross-sectional view illustrating an operation of forming a photoresist on a metal seed layer provided among the operations of the method of manufacturing the semiconductor package according to one or more example embodiments.

FIG. 11 is a cross-sectional view illustrating an operation of removing the photoresist provided among the operations of the method of manufacturing the semiconductor package according to one or more example embodiments.

FIG. 13 is a cross-sectional view illustrating an operation of molding the metal seed layer and the metal layer with a dielectric material provided among the operations of the method of manufacturing the semiconductor package according to one or more example embodiments.

FIG. 14 is a cross-sectional view illustrating an operation of forming a laser marking pattern on the dielectric layer provided among the operations of the method of manufacturing the semiconductor package according to one or more example embodiments.

DETAILED DESCRIPTION

Figure 2:
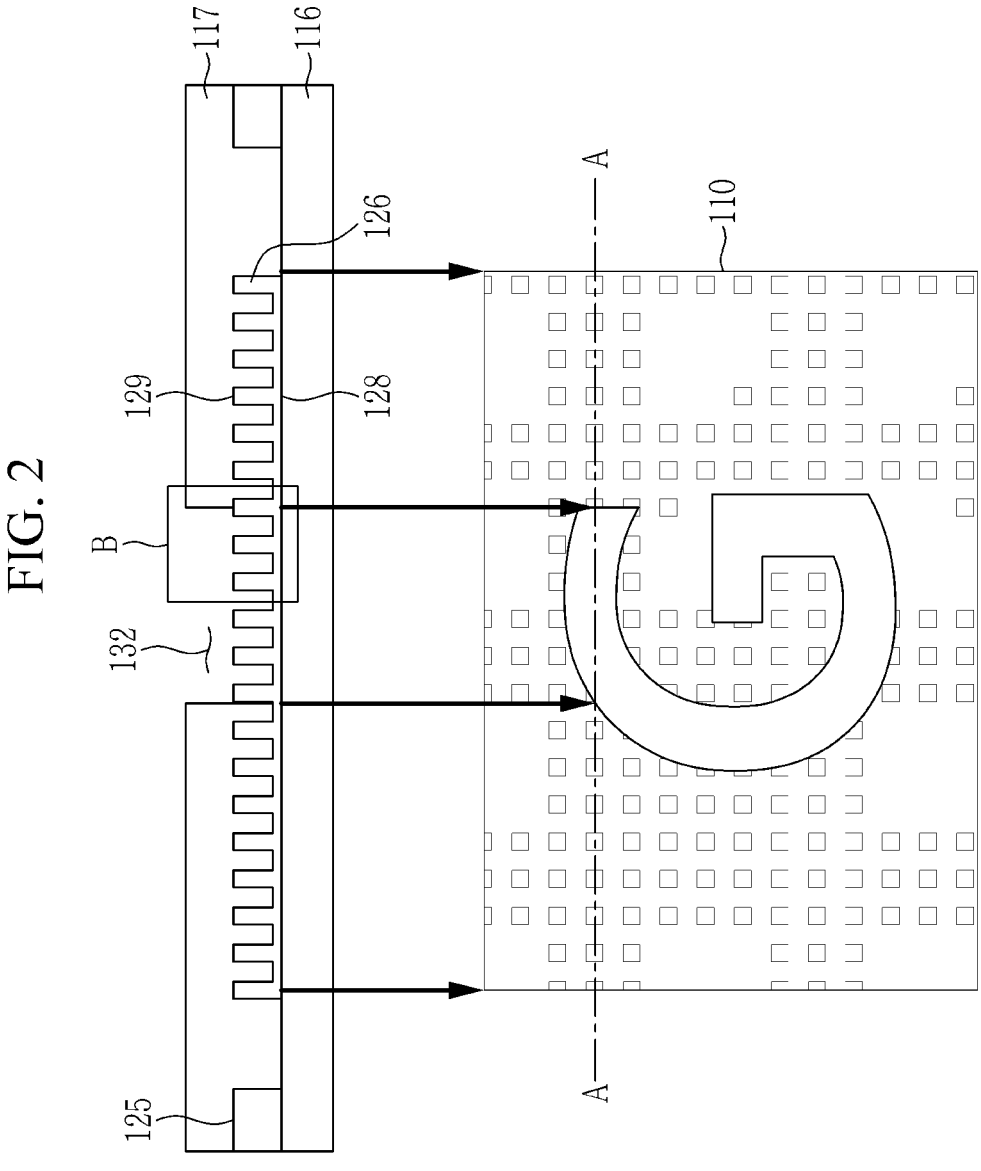
FIG. 2 is a top plan view illustrating an upper surface of a marking region of a back side redistribution layer according to one or more example embodiments, and a cross-sectional view illustrating a surface of the marking region in the back side redistribution layer cut in the A-A direction in the top plan view.

In the following detailed description, only one or more example embodiments have been illustrated and described, simply by way of illustration. As those skilled in the art will realize, the described example embodiments may be modified in various different ways, without departing from the spirit or scope of the present disclosure.

The drawings and description are to be regarded as illustrative in nature and not restrictive. Like reference numerals designate like elements throughout the specification and drawings.

In addition, the size and thickness of each configuration illustrated in the drawings are arbitrarily illustrated for understanding and ease of description, but embodiments are not limited thereto.

Throughout the specification, when a part is said to be "connected" to another part, this includes not only a case where the parts are "directly connected" but also a case where the parts are "indirectly connected" with another member interposed therebetween. In addition, unless explicitly described to the contrary, the word "comprise", and variations such as "comprises" or "comprising", will be understood to imply the inclusion of stated elements but not the exclusion of any other elements. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is "on" a reference portion, the element is located above or below the reference portion, and it does not necessarily mean that the element is located "above" or "on" in a direction opposite to gravity.

Further, in the entire specification, when it is referred to as "in a plane", it means when a target part is viewed from above, and when it is referred to as "in a cross-section", it means when the cross-section obtained by cutting a target part vertically is viewed from the side.

Hereinafter, a semiconductor package of example embodiments will be described with reference to the drawings.

Figure 1:
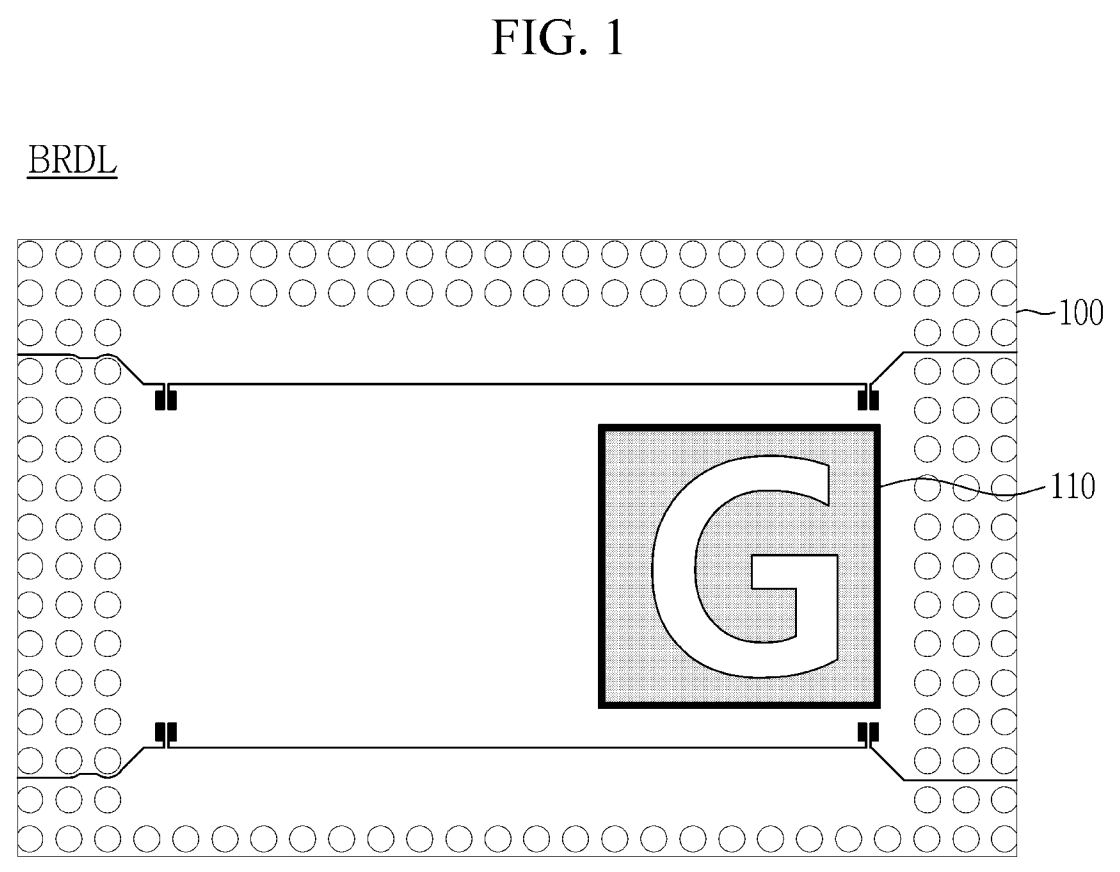

FIG. 1 is a top plan view illustrating an upper surface of a back side redistribution layer BRDL including a redistribution region 100 and a marking region 110 according to one or more example embodiments.

The back side redistribution layer BRDL of a package-on-package type semiconductor package may include a redistribution region 100 and a marking region 110. The marking region 110 is a region for marking an alignment mark or a recognition mark. In FIG. 1, the mark of the letter G is displayed in the marking region 110. The mark may be formed by engraving a dielectric layer of the marking region 110 by using a laser. The marking region 110 may be electrically insulated from the redistribution region 100. In FIG. 1, the marking region 110 is illustrated to be biased to the right, but in one or more example embodiments, the marking region 110 may be formed at a different position within the inner side of the redistribution region 100.

FIG. 2 is a top plan view illustrating an upper surface of the marking region 110 of the back side redistribution layer BRDL according to one or more example embodiments (see lower portion of FIG. 2), and a cross-sectional view illustrating the surface of the marking region 110 in the back side redistribution layer BRDL cut in the A-A direction in the top plan view (see upper portion of FIG. 2).

Referring to FIG. 2, a cross-sectional view of the marking region 110 of the back side redistribution layer BRDL cut in the A-A direction is illustrated in the upper portion of FIG. 2, and, as shown in the bottom portion of FIG. 2, the marking region 110 in the top plan view corresponding to the marking region 110 in the cross-sectional view is indicated by an arrow.

In the cross-sectional view of FIG. 2, a metal pad 126 is disposed on a lower dielectric layer 116, and a redistribution line 125 is disposed at the same level as a metal pad 126. In one or more example embodiments, the lower dielectric layer 116 may be formed of a thermosetting resin, including, but not limited to, an epoxy resin. In one or more example embodiments, the lower dielectric layer 116 may be formed of a film (for example, Ajinomoto Build-up Film (ABF)), in which a reinforcing material, such as an inorganic filler, is uniformly dispersed in an epoxy resin.

The metal pad 126 may include a metal seed layer 128 and a metal layer 129 disposed on the metal seed layer 128. In one or more example embodiments, the metal pad 126 may include at least one of copper, aluminum, nickel, titanium, palladium, silver, and gold. In one or more example embodiments, the metal pad 126 may be electrically insulated from the redistribution line 125. In one or more example embodiments, the metal pad 126 may be electrically coupled to the redistribution line 125 or other conductive feature parts (for example, a through via, a ground member, or a conductive connection member). In one or more example embodiments, the bottom of the metal pad 126 is completely embedded by the lower dielectric layer 116 and the top and sides of the metal pad 126 are completely embedded by the upper dielectric layer 117, so that the metal pad 126 may be electrically floated. In one or more example embodiments, the metal pad 126 is positioned at the same level as the redistribution line 125 and may be simultaneously formed in the operation of forming the redistribution line 125. In one or more example embodiments, the metal seed layer 128 may extend over all or a portion of the marking region 110. In one or more example embodiments, the metal layer 129 may include a pattern and may extend over all or a portion of the metal seed layer 128.

The top and the sides of the metal pad 126 may be molded by the upper dielectric layer 117. In one or more example embodiments, the upper dielectric layer 117 may be formed of a thermosetting resin, including, but not limited to, an epoxy resin, in the same manner as the lower dielectric layer 116. In one or more example embodiments, the lower dielectric layer 116 may be formed of a film (for example, ABF) in which a reinforcing material, including, but not limited to, an inorganic filler, may be uniformly dispersed in an epoxy resin in a similar manner as the lower dielectric layer 116. In one or more example embodiments, the upper dielectric layer 117 may be formed of a different material from that of the lower dielectric layer 116.

An alignment mark or recognition mark may be provided on the upper dielectric layer 117. The mark may be engraved on the upper dielectric layer 117 using a laser. The alignment mark may include, for example, the shape of various figures, including, but not limited to, a cross, a rectangle, and a circle. The recognition mark may include, for example, product information including, but not limited to, letters or numbers, a barcode, a QR code, a manufacturer name, a product model name, and a brand name. A trench 132 may be formed in the upper dielectric layer 117 according to a mark shape using laser marking. Because the upper dielectric layer 117 is burned by the laser, the upper surface of the metal seed layer 128 of the metal pad 126 and the upper surface and sidewalls of the metal layer 129 may be exposed in the trench 132.

Figure 3:
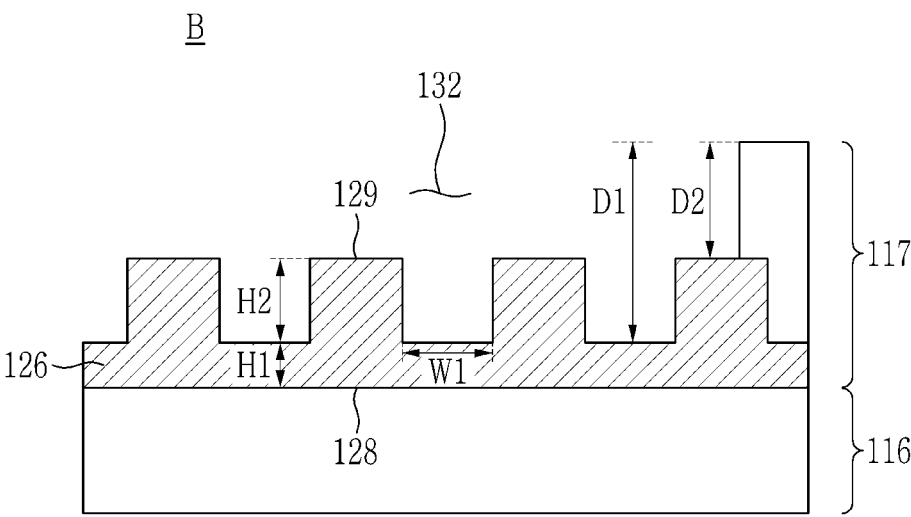
FIG. 3 is an enlarged cross-sectional view illustrating area B and illustrating the surface of the marking region of the back side redistribution layer cut in the direction A-A in the top plan view of FIG. 2 according to one or more example embodiments.

FIG. 3 is an enlarged cross-sectional view illustrating area B in the cross-sectional view illustrating the surface of the marking region 110 of the back side redistribution layer BRDL cut in the direction A-A in the top plan view of FIG. 2 according to one or more example embodiments.

Referring to FIG. 3, the metal pad 126 may include the metal seed layer 128 that extends over all or a portion of the marking region 110, and the metal layer 129 disposed on the top of the metal seed layer 128 and may include a pattern. The metal seed layer 128 may be provided on the lower dielectric layer 116 over all or a portion of the marking region 110. The laser cannot pass through the metal seed layer 128, and the metal seed layer 128 serves to protect the lower dielectric layer 116 from the laser marking. Accordingly, even after the trench 132 is formed in the upper dielectric layer 117 in the marking region 110 with a laser, the metal seed layer 128 may block the exposure of the lower dielectric layer 116. In one or more example embodiments, the metal seed layer 128 may have a thickness H1 of 1 μm to 4 μm. When the thickness H1 of the metal seed layer 128 is larger than 4 μm, moisture generated between the metal seed layer 128 and the lower dielectric layer 116 cannot be discharged, so that cracks may be generated in the back side redistribution layer BRDL.

The metal layer 129 may include a pattern of any shape. When the metal layer 129 having a cross-section having a pattern of a rectangular shape, a trapezoidal shape, or an inverted trapezoidal shape is disposed on the metal seed layer 128, the metal pad 126 may include a plurality of concave portions when viewed in cross-section. Concave portions adjacent to each other among the plurality of concave portions of the metal pad 126 may have a predetermined interval. In one or more example embodiments, the plurality of concave portions may have a width W1 of 35 μm or less. When the gap W1 of the concave portions exceeds 35 μm, a phenomenon in which the upper dielectric layer 117 may be depressed between the concave portions may occur, which may cause a problem in leveling the back side redistribution layer BRDL. In one or more example embodiments, the metal layer 129 may have a thickness H2 of 20 μm to 40 μm.

When a pattern of an arbitrary shape is not provided on the metal layer 129, the metal seed layer 128 and the metal layer 129 form one dummy metal pad having a thickness greater than that of one or more example embodiments. When the package-on-package type semiconductor package is manufactured by using the dummy metal pad, moisture generated between the dummy metal pad and the dielectric layer disposed under the dummy metal pad cannot be discharged, so cracks may be generated between the dummy metal pad and the dielectric layer under the dummy metal pad. Therefore, when the semiconductor package is manufactured by using the dummy metal pad, a problem may occur in mass production yield.

The trench 132 may be formed by burning the upper dielectric layer 117 with a laser while protecting the lower dielectric layer 116 with the metal seed layer 128 during laser marking. The top surface of the metal seed layer 128 of the metal pad 126 and the top surface and sidewalls of the metal layer 129 are exposed through the trench 132.

The trench 132 may have a first marking depth D1 extending from the top surface of the upper dielectric layer 117 to the top surface of the metal seed layer 128. In one or more example embodiments, the trench 132 may have a marking depth D1 of 43.5 μm to 69.5 μm. The trench 132 may have a second marking depth D2 extending from the top surface of the upper dielectric layer 117 to the top surface of the metal layer 129. In one or more example embodiments, the trench 132 may have a marking depth D2 of 23.5 μm to 29.5 μm.

Figure 4A:
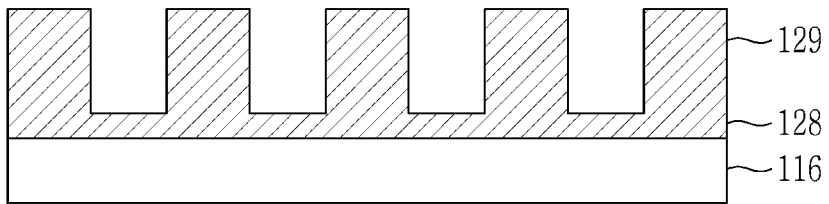
FIG. 4A is a cross-sectional view illustrating a metal seed layer and a metal layer including a pattern in one or more example embodiments.
Figure 4B:
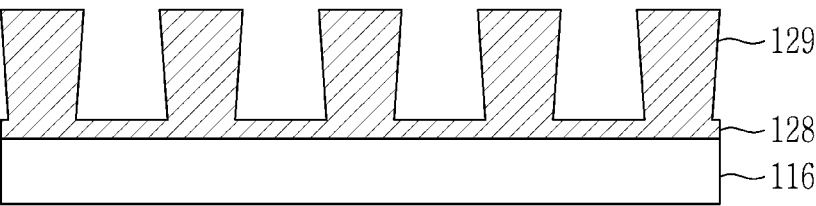
FIG. 4B is a cross-sectional view illustrating a metal seed layer and a metal layer including a pattern according to one or more example embodiments.
Figure 4C:
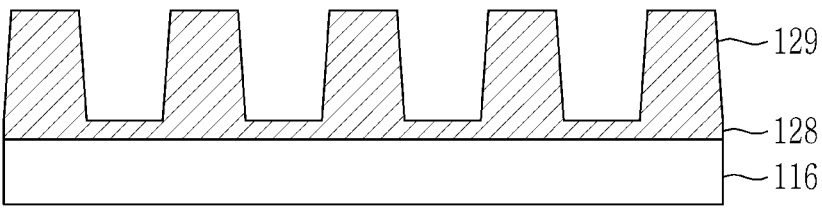
FIG. 4C is a cross-sectional view illustrating a metal seed layer and a metal layer including a pattern according to one or more example embodiments.

FIGS. 4A, 4B, and 4C are cross-sectional views illustrating the metal seed layer 128 and the metal layer 129 including patterns of one or more example embodiments. The cross-section of the pattern of the metal layer 129 may include at least one shape of a rectangular shape (see FIG. 4A), a trapezoid shape (see FIG. 4B), and an inverted trapezoid shape (see FIG. 4C) depending on the patterning shape or etching method of a dry film photoresist (DFR) to be described later.

Because the upper surface of the metal seed layer 128 and the upper surface of the metal layer 129 are exposed through the trench 132 in the upper dielectric layer 117, the visibility of the mark may be greatly improved. In addition, the metal seed layer 128 may protect the lower dielectric layer 116 from the laser. In addition, due to the metal layer 129 including the pattern having a regular interval, it is possible to match the leveling with the redistribution region and to prevent the upper dielectric layer 117 from being recessed.

Figure 5:
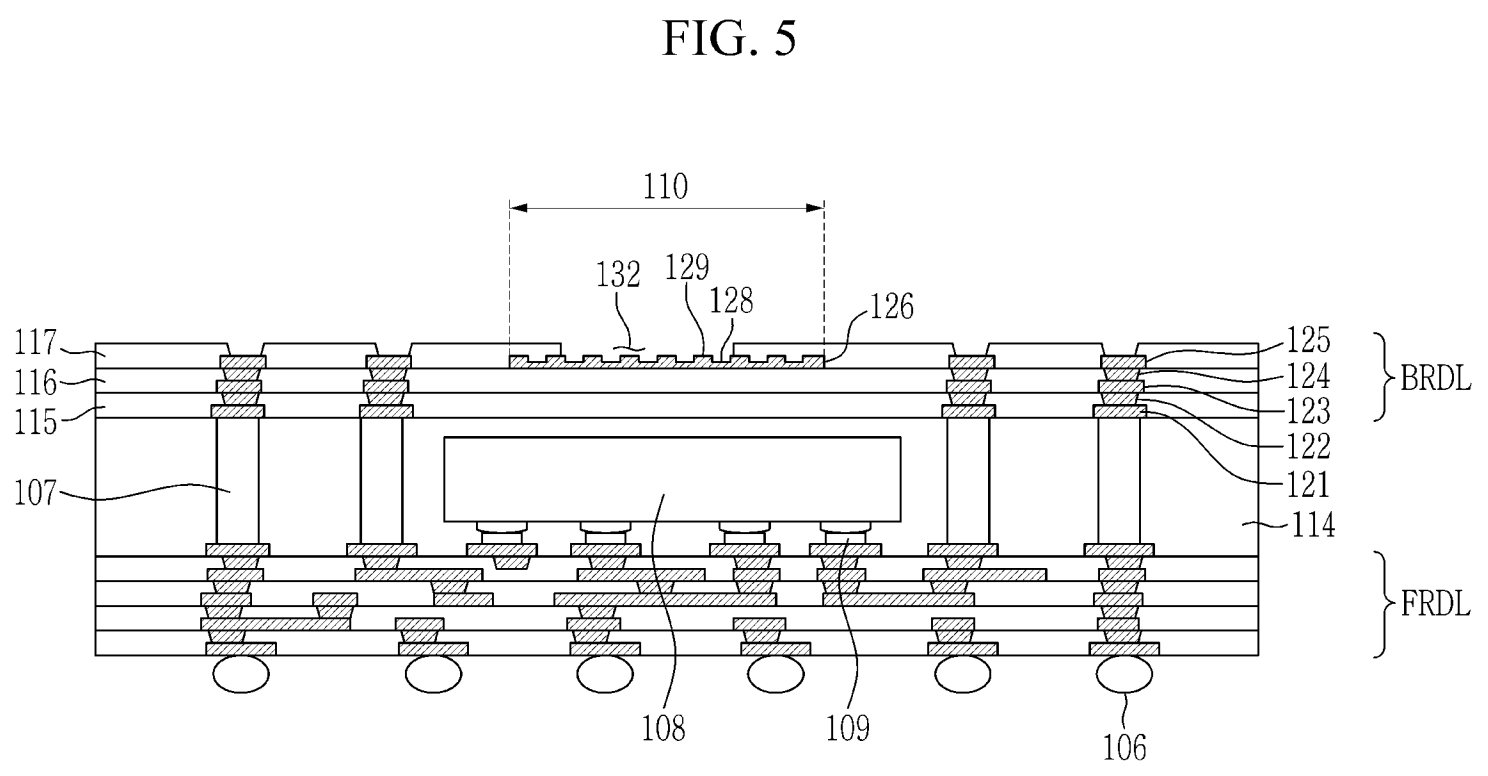

FIG. 5 is a cross-sectional view illustrating a package-on-package type semiconductor package including the back side redistribution layer BRDL on which a laser marking pattern is formed according to one or more example embodiments.

Referring to FIG. 5, a package-on-package type semiconductor package may include a semiconductor chip 108. The semiconductor chip 108 may be bonded and electrically coupled to a front side redistribution layer FRDL by the conductive connection member 109. Although one semiconductor chip 108 is illustrated in FIG. 5, a plurality of semiconductor chips may be included. In one or more example embodiments, the semiconductor chip 108 may be a system on chip (SOC).

The package-on-package type semiconductor package may include a through via 107. The through via 107 may be disposed on the front side redistribution layer FRDL and may electrically couple the front side redistribution layer FRDL and the back side redistribution layer BRDL. In one or more example embodiments, the upper surface of the through via 107 may be positioned at the same level as the lower surface of the back side redistribution layer BRDL, and the lower surface of the through via 107 may be positioned at the same level as the upper surface of the front side redistribution layer FRDL. In one or more example embodiments, the through via 107 may include, but is not limited to, at least one of copper, aluminum, tungsten, nickel, gold, tin, titanium, and alloys thereof.

The package-on-package type semiconductor package may include the front side redistribution layer FRDL. The front side redistribution layer FRDL may include a redistribution line and a dielectric layer. In one or more example embodiments, the redistribution line may be formed of at least one of copper, aluminum, nickel, titanium, and an alloy thereof. In one or more example embodiments, the dielectric layer may be formed of a polymer, including, but not limited to, polybenzoxazole (PBO) and polyimide. In one or more example embodiments, the dielectric layer may be formed of an inorganic dielectric material, including, but not limited to, silicon nitride and silicon oxide. The uppermost redistribution line of the front side redistribution layer FRDL may be bonded to the through via 107 and the semiconductor chip 108, and may be electrically coupled to the back side redistribution layer BRDL and the semiconductor chip 108. The lowermost redistribution line of the front side redistribution layer FRDL may be bonded to the solder ball 106, which may be electrically coupled to an external device.

The package-on-package type semiconductor package may include a molding material 114. The molding material 114 molds the through via 107, the semiconductor chip 108, and the front side redistribution layer FRDL. The molding material 114 may surround the semiconductor chip 108. In one or more example embodiments, the upper surface of the molding material 114 may be positioned at the same level as the upper surface of the through via 107. In one or more example embodiments, the lower surface of the molding material 114 may be positioned at the same level as the lower surface of the through via 107 and the upper surface of the front side redistribution layer FRDL. In one or more example embodiments, the molding material 114 may be a molding compound, a molding underfill, an epoxy, and/or a resin.

The package-on-package type semiconductor package may include the back side redistribution layer BRDL. The back side redistribution layer BRDL may include vias 122 and 124, redistribution lines 121, 123 and 125, dielectric layers 115, 116 and 117, and a metal pad 126. In one or more example embodiments, the vias 122 and 124, the redistribution lines 121, 123 and 125, and the metal pad 126 may be formed of at least one of copper, aluminum, nickel, titanium, palladium, silver, and gold. In one or more example embodiments, the dielectric layers 115, 116, and 117 may be formed of a thermosetting resin, including, but not limited to, an epoxy resin. In one or more example embodiments, the dielectric layers 115, 116, and 117 may be formed of ABF in which a reinforcing material, including, but not limited to, an inorganic filler, may be uniformly dispersed in an epoxy resin. The lowermost redistribution line of the back side redistribution layer BRDL may be bonded to the through via 107 and electrically coupled to the through via 107.

In one or more example embodiments of FIG. 5, the vias 122 and 124, redistribution lines 121, 123 and 125, and dielectric layers 115, 116 and 117 are illustrated, but the number of vias, redistribution lines, and dielectric layers are not limited thereto, and a larger number of vias, redistribution lines, and dielectric layers may be included.

FIGS. 6, 7, 8, 9, 10, 11, 12, 13 and 14 illustrate a series of operations of a method of manufacturing a semiconductor package according to one or more example embodiments, from an operation of forming the lower dielectric layer 116 of the back side redistribution layer BRDL to an operation of forming the laser marking pattern.

Figure 6:
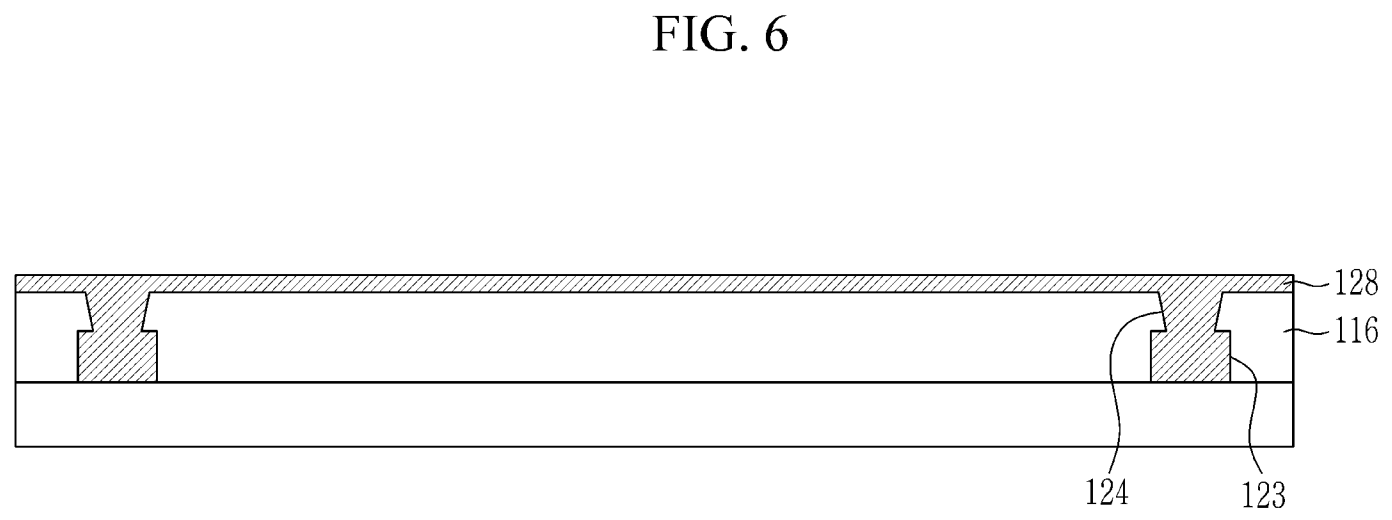

FIG. 6 is a cross-sectional view illustrating an operation of forming a metal seed layer 128 on a dielectric layer 116 provided among the operations of a method of manufacturing a semiconductor package according to one or more example embodiments.

Referring to FIG. 6, the metal seed layer 128 may be provided on the lower dielectric layer 116 where the redistribution line 123 and the via 124 are formed. In one or more example embodiments, the metal seed layer 128 may include, but is not limited to, at least one of copper, aluminum, nickel, titanium, palladium, silver, and gold. In one embodiment, the metal seed layer 128 may be formed by electroless plating. In one or more example embodiments, a cleaning process or a metal catalyst activation pretreatment process may be performed prior to the electroless plating. In one or more example embodiments, a chemical mechanical polishing (CMP) process for post-processing may be performed after the electroless plating. In one or more example embodiments, the metal seed layer 128 may be formed by sputtering. In one or more example embodiments, the metal seed layer 128 may have a thickness of 1 μm to 4 μm.

Figure 7:
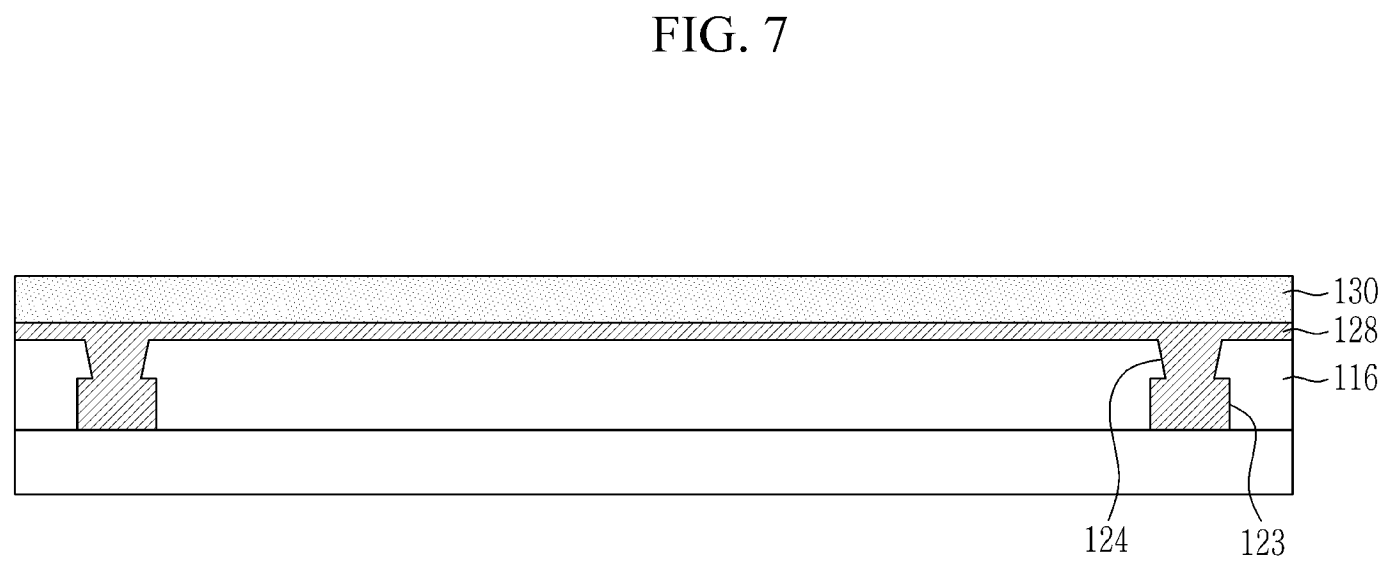

FIG. 7 is a cross-sectional view illustrating an operation of forming a photoresist 130 on the metal seed layer 128 provided among the operations of the method of manufacturing the semiconductor package according to one or more example embodiments.

Referring to FIG. 7, a photoresist 130 having a predetermined thickness may be provided on the metal seed layer 128. In one or more example embodiments, the photoresist 130 may include a photosensitive film. A photosensitive film may be provided on the metal seed layer 128 through a lamination process.

Figure 8:
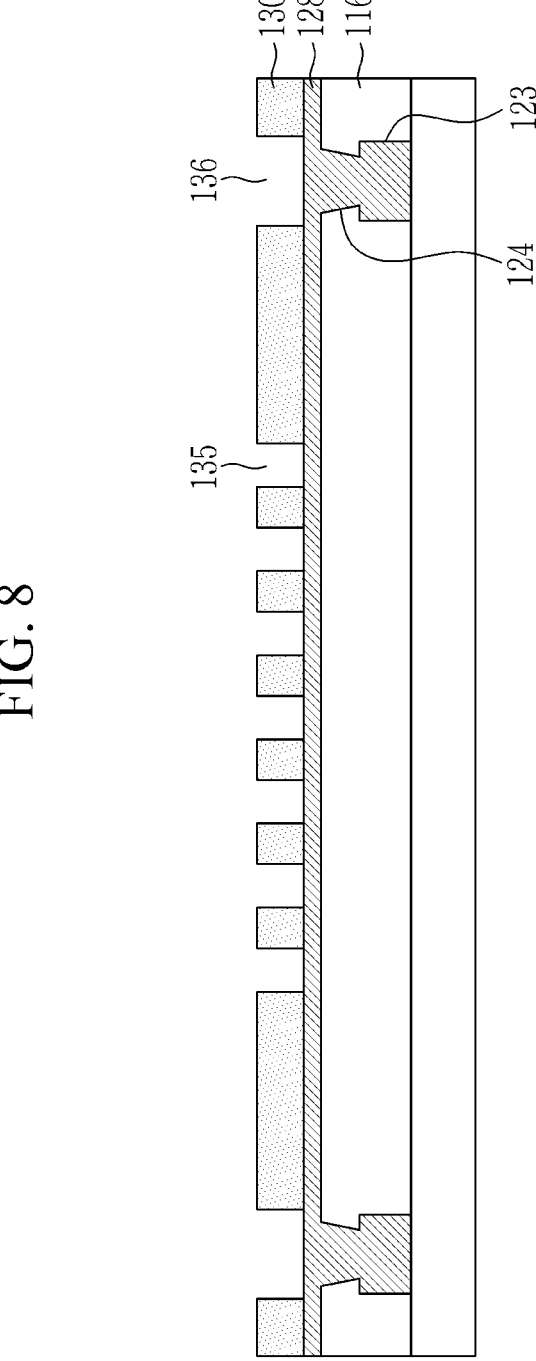
FIG. 8 is a cross-sectional view illustrating an operation of patterning a photoresist provided among the operations of the method of manufacturing the semiconductor package according to one or more example embodiments.

FIG. 8 is a cross-sectional view illustrating an operation of patterning the photoresist 130 provided among the operations of the method of manufacturing the semiconductor package according to one or more example embodiments.

Referring to FIG. 8, a photo mask may be aligned on the photoresist 130, and the photoresist 130 may be exposed and developed. The photoresist 130 may include a first opening 135 for forming a metal layer 129 and a second opening 136 for forming the redistribution line 125.

Figure 9:
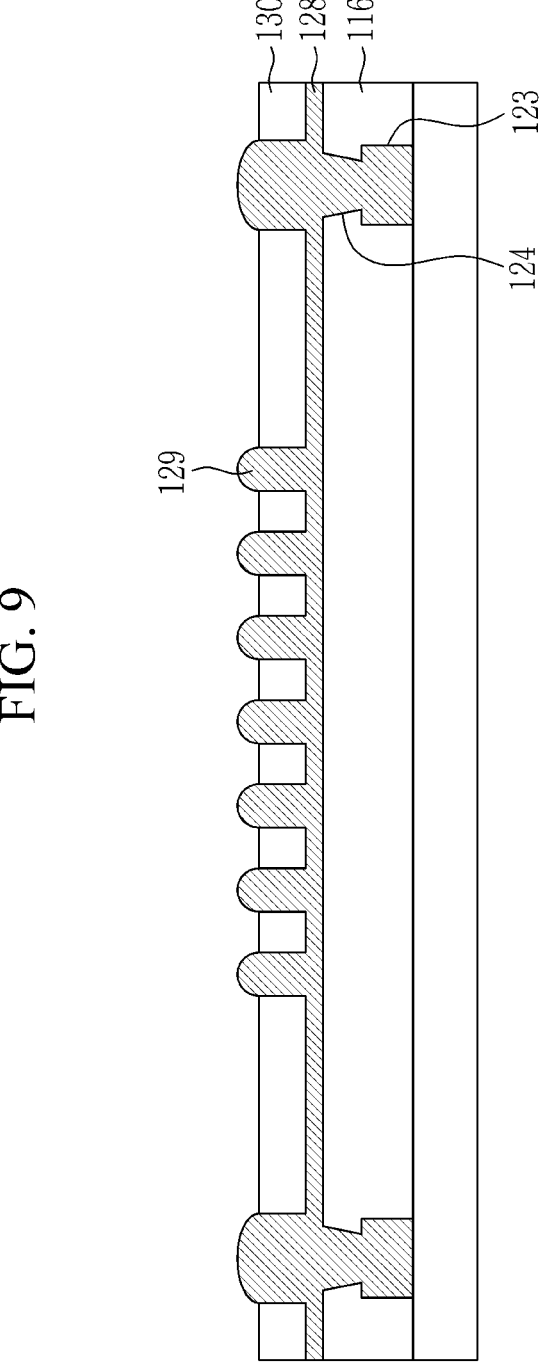
FIG. 9 is a cross-sectional view illustrating an operation of plating a metal layer in an opening of the patterned photoresist provided among the operations of the method of manufacturing the semiconductor package of one or more example embodiments.

FIG. 9 is a cross-sectional view illustrating an operation of plating the metal layer 129 in an opening of the patterned photoresist 130 provided among the operations of the method of manufacturing the semiconductor package of one or more example embodiments.

Referring to FIG. 9, the metal layer 129 may be formed in the first opening 135 and the second opening 136 of the photoresist 130. In one or more example embodiments, the metal layer 129 may include, but is not limited to, at least one of copper, aluminum, nickel, titanium, palladium, silver, and gold. In one or more example embodiments, the metal layer 129 may be formed by electroplating.

Figure 10:
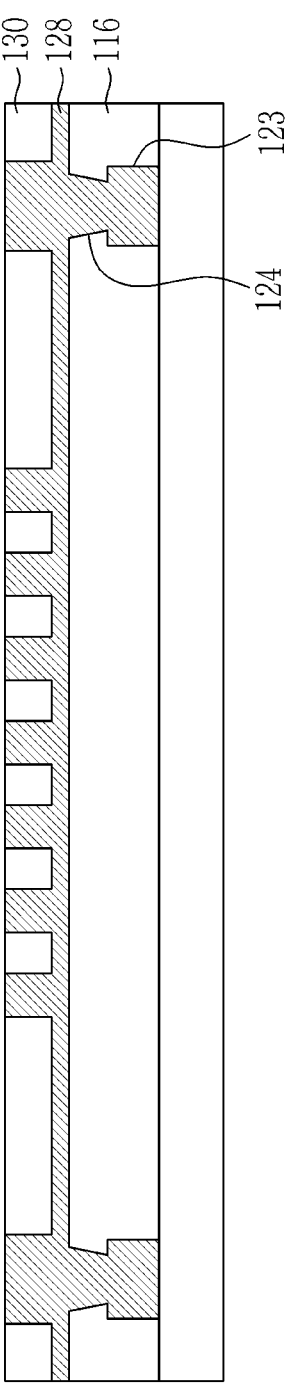
FIG. 10 is a cross-sectional view illustrating an operation of performing chemical mechanical polishing (CMP) for planarization of the metal layer provided among the operations of the method of manufacturing the semiconductor package according to one or more example embodiments.

FIG. 10 is a cross-sectional view illustrating an operation of performing the CMP for planarization of the metal layer 129 provided among the operations of the method of manufacturing the semiconductor package according to one or more example embodiments.

Referring to FIG. 10, after filling the first opening 135 and the second opening 136 of the photoresist 130, the metal layer 129 protruding from the upper surface of the photoresist 130 may be removed by CMP. In one or more example embodiments, after the CMP, the metal layer 129 may have a thickness of 20 μm to 40 μm.

Figure 11:
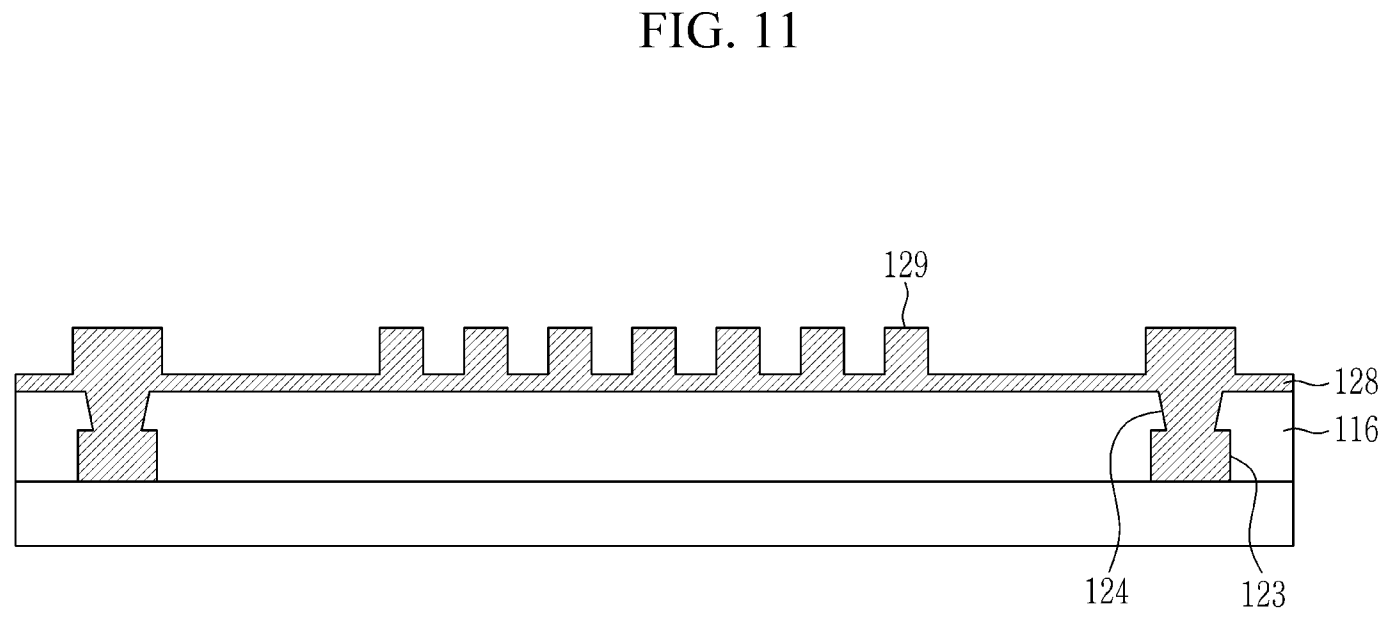

FIG. 11 is a cross-sectional view illustrating an operation of removing the photoresist 130 provided among the operations of the method of manufacturing the semiconductor package according to one or more example embodiments.

Referring to FIG. 11, the photoresist 130 may be removed. After the photoresist 130 is removed, patterns of the metal layer 129 are exposed, and when viewed in cross section, the metal pad 126 including a plurality of concave portions may be formed. In one or more example embodiments, among the plurality of concave portions, concave portions adjacent to each other may have regular intervals. In one or more example embodiments, the plurality of concave portions may have a width W1 of 35 μm or less.

Figure 12:
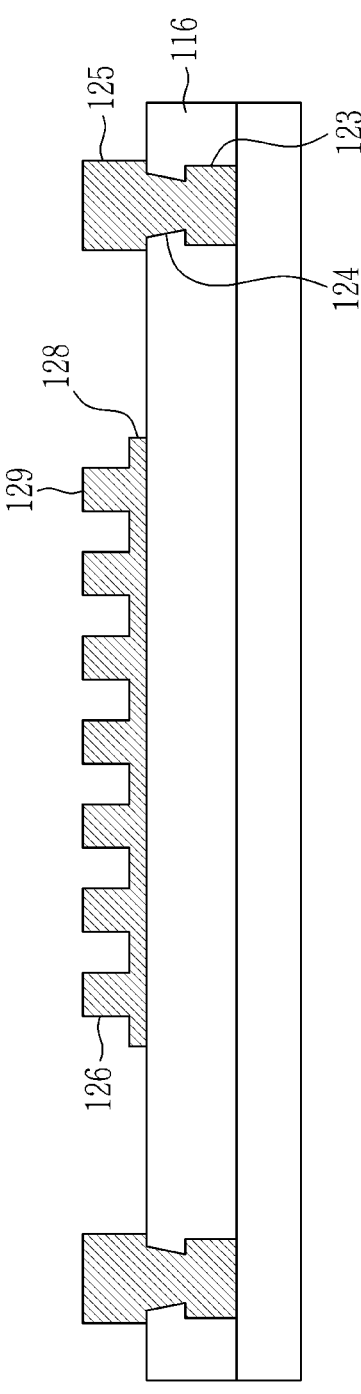
FIG. 12 is a cross-sectional view illustrating an operation of removing a portion of the metal seed layer provided among the operations of the method of manufacturing the semiconductor package according to one or more example embodiments.

FIG. 12 is a cross-sectional view illustrating an operation of removing a portion of the metal seed layer 128 provided among the operations of the method of manufacturing the semiconductor package according to one or more example embodiments.

Referring to FIG. 12, a portion of the metal seed layer 128 between the metal seed layer 128 of the marking region 110 and the metal seed layer 128 of the redistribution region 100 may be removed. The removal process proceeds through operations comprising DFR lamination, exposure, development, and etching. The metal pad 126 may be electrically insulated from the redistribution line 125 by removing the metal seed layer 128 between the metal seed layer 128 of the redistribution region 100 and the metal seed layer 128 of the marking region 110.

Figure 13:
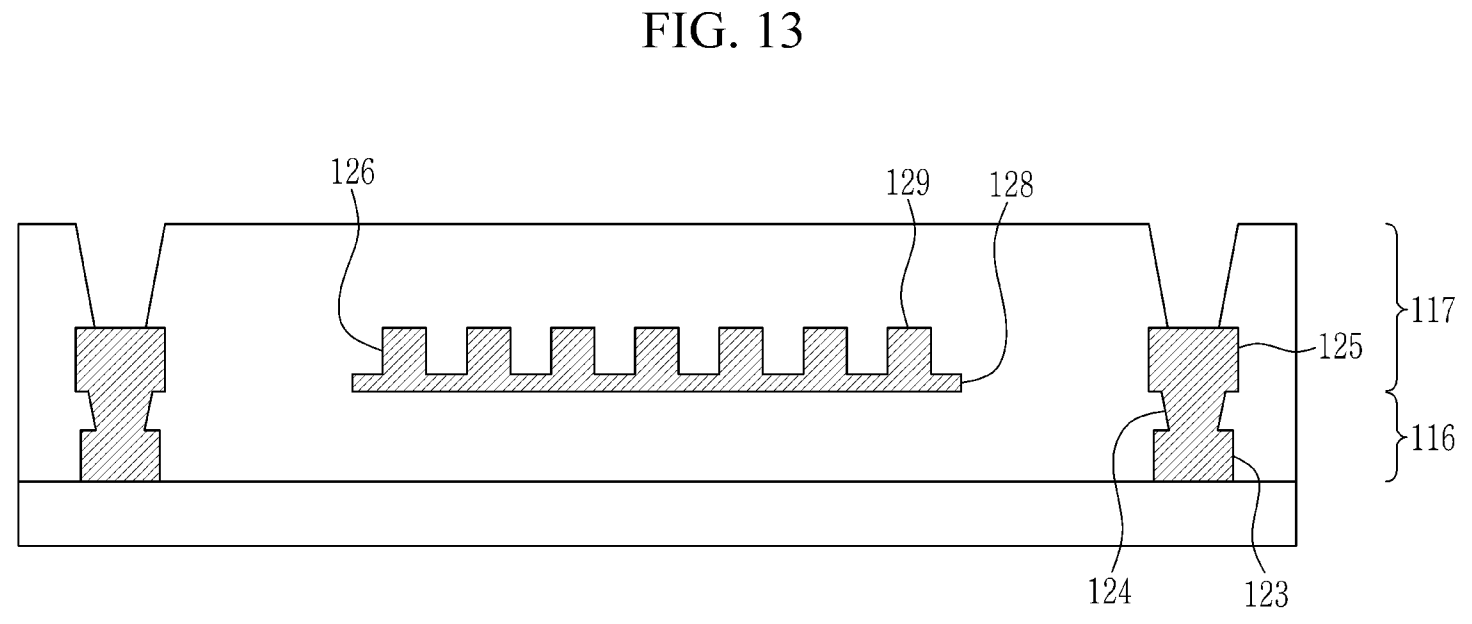

FIG. 13 is a cross-sectional view illustrating an operation of molding the metal seed layer 128 and the metal layer 129 with a dielectric material provided among the operations of the method of manufacturing the semiconductor package according to one or more example embodiments.

Referring to FIG. 13, the metal pad 126 including the metal seed layer 128 and the metal layer 129 and the redistribution line 125 are molded into an upper dielectric layer 117. The bottom of the metal pad 126 may be completely embedded by the lower dielectric layer 116 and the top and sides of the metal pad 126 are completely embedded by the upper dielectric layer 117, so that the metal pad 126 may be electrically floated.

Figure 14:
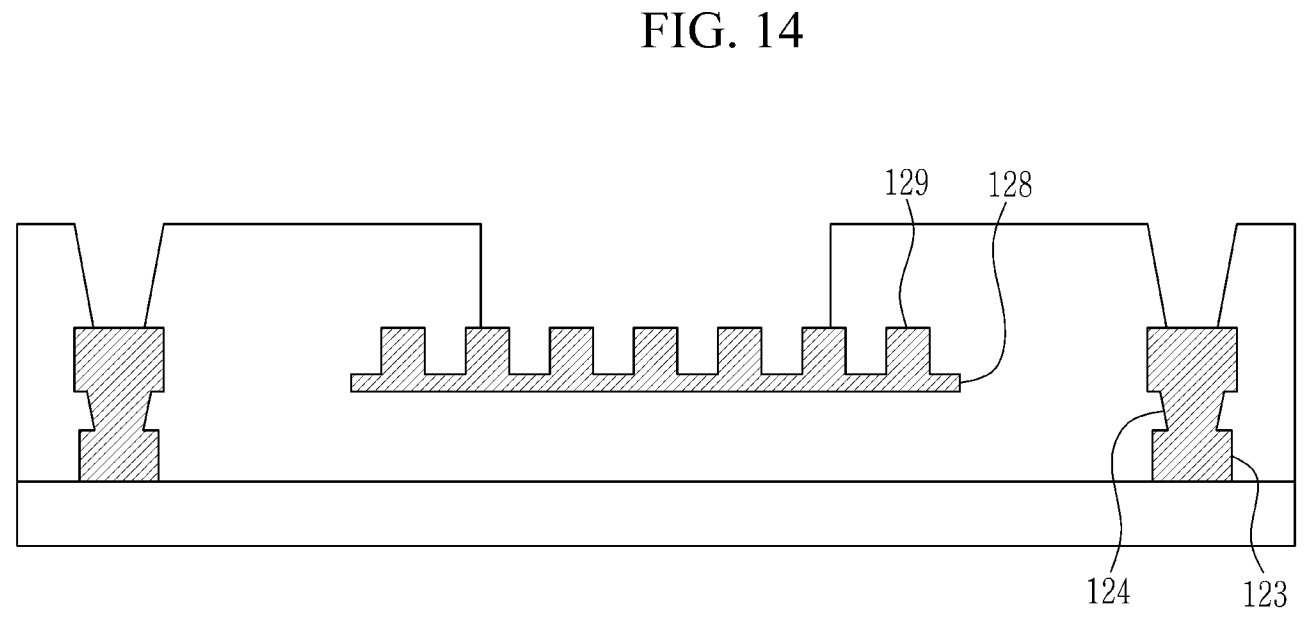

FIG. 14 is a cross-sectional view illustrating an operation of forming a laser marking pattern on the upper dielectric layer 117 provided among the operations of the method of manufacturing the semiconductor package according to one or more example embodiments.

Referring to FIG. 14, a marking pattern may be provided on the upper dielectric layer 117 of the marking region 110 using a laser. Because the marking pattern is formed by removing the upper dielectric layer 117 from the upper surface of the upper dielectric layer 117 to the upper surfaces of the metal seed layer 128 and the metal layer 129, when the mark is inspected, the upper surface of the metal seed layer 128 and the upper surface of the metal layer 129 are exposed, so that visibility of the mark may be improved.

According to one or more example embodiments, in a package on package, it is possible to improve mark visibility by forming a metal seed layer and a metal layer in the dielectric layer included in a back side redistribution layer, and to protect a lower dielectric layer of the dielectric layer including the metal seed layer and the metal layer.

According to one or more example embodiments, a metal layer may be processed to have a pattern at a predetermined interval, thereby reducing a ratio of the metal layer in the dielectric layer, mitigating warpage deformation, and manufacturing a mass-producible semiconductor package.

Although embodiments have been shown and described, one or more example embodiments are not limited thereto, and it is possible to carry out various modifications in form and details may be made therein without departing from the spirit and scope of the following claims.

What is claimed is:

1. A semiconductor package comprising:
   a first redistribution substrate;
   a semiconductor chip provided on the first redistribution substrate;
   a molding material molding the semiconductor chip and the first redistribution substrate; and
   a second redistribution substrate provided on the molding material,
   wherein the second redistribution substrate comprises:
      at least one redistribution line;
      a metal pad; and
      a dielectric layer molding the at least one redistribution line and the metal pad,
   wherein the dielectric layer includes a marking region on the metal pad, and
   wherein the metal pad includes a plurality of concave portions.

2. The semiconductor package of claim 1, wherein the dielectric layer comprises a film in which an epoxy resin and an inorganic filler are uniformly dispersed.

3. The semiconductor package of claim 1, wherein the metal pad is electrically insulated from the at least one redistribution line.

4. The semiconductor package of claim 1, wherein the metal pad comprises at least one of copper, aluminum, nickel, titanium, palladium, silver, and gold.

5. The semiconductor package of claim 1, wherein a cross-section of each of the plurality of concave portions comprises at least one of a rectangular shape, a trapezoidal shape, and an inverted trapezoidal shape.

6. The semiconductor package of claim 1, further comprising:
   a marking pattern in the marking region, wherein the metal pad is exposed through the marking pattern on an upper surface of the dielectric layer.

7. The semiconductor package of claim 1, wherein the plurality of concave portions comprises concave portions that are adjacent to each other and arranged at a predetermined interval.

8. A semiconductor package comprising:
   a first redistribution substrate comprising:
      a first dielectric layer; and
      at least one first redistribution line provided in the first dielectric layer;
   a semiconductor chip provided on the first redistribution substrate;
   a through via provided on the first redistribution substrate;
   a conductive connection member electrically coupling the at least one first redistribution line and the semiconductor chip;
   a molding material molding the first redistribution substrate, the semiconductor chip, and the through via; and
   a second redistribution substrate provided on the molding material,
   wherein the second redistribution substrate comprises:
      a second dielectric layer;
      at least one second redistribution line;
      a metal pad provided on the second dielectric layer; and
      a third dielectric layer molding the second dielectric layer, the at least one second redistribution line, and the metal pad,
   wherein the through via electrically couples the first redistribution substrate and the second redistribution substrate,
   wherein the third dielectric layer comprises a marking region, wherein the marking region comprises a marking pattern, and
   wherein the metal pad comprises:
      a metal seed layer; and
      a metal layer comprising a pattern provided at a predetermined interval on the metal seed layer.

9. The semiconductor package of claim 8, wherein the marking pattern has a first marking depth extending from an upper surface of the third dielectric layer to an upper surface of the metal seed layer.

10. The semiconductor package of claim 8, wherein each of the second dielectric layer and the third dielectric layer comprises an Ajinomoto build-up film (ABF).

11. The semiconductor package of claim 8, wherein the metal pad is embedded by the second dielectric layer and the third dielectric layer.

12. The semiconductor package of claim 8, wherein the metal pad is configured to block laser exposure of the second dielectric layer in the marking region.

13. The semiconductor package of claim 8, wherein the predetermined interval is 35 $\mu$m or less.

14. The semiconductor package of claim 8, wherein the metal seed layer has a thickness of 1 $\mu$m to 4 $\mu$m.

15. The semiconductor package of claim 8, wherein the metal layer has a thickness of 20 $\mu$m to 40 $\mu$m.

16. The semiconductor package of claim 8, wherein the marking pattern has a second marking depth extending from an upper surface of the third dielectric layer to an upper surface of the metal layer.

17. The semiconductor package of claim 16, wherein the second marking depth is 23.5 $\mu$m to 29.5 $\mu$m.

\* \* \* \* \*